(12) United States Patent
Nishijima

(10) Patent No.: US 6,800,929 B1
(45) Date of Patent: Oct. 5, 2004

(54) SEMICONDUCTOR DEVICE

(75) Inventor: Masaaki Nishijima, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/351,160

(22) Filed: Jul. 12, 1999

(30) Foreign Application Priority Data

Jul. 14, 1998 (JP) .......................................... 10-198269

(51) Int. Cl.$^7$ .............................................. H01L 29/40
(52) U.S. Cl. .................................... 257/664; 257/758
(58) Field of Search ................................ 257/664, 663, 257/662, 758, 659, 508, 635–644, 759, 760; 438/618

(56) References Cited

U.S. PATENT DOCUMENTS

| | | | | |
|---|---|---|---|---|
| 4,751,482 A | * | 6/1988 | Fukuta et al. ............... | 333/247 |
| 5,185,650 A | * | 2/1993 | Wakimoto et al. .......... | 257/508 |
| 5,194,833 A | * | 3/1993 | Dougherty et al. .......... | 333/33 |
| 5,357,138 A | * | 10/1994 | Kobayashi .................. | 257/664 |
| 5,448,112 A | * | 9/1995 | Hara .......................... | 257/758 |
| 5,448,208 A | | 9/1995 | Honjo | |
| 5,567,982 A | * | 10/1996 | Bartelink ..................... | 257/664 |
| 5,661,344 A | * | 8/1997 | Havemann et al. ......... | 257/758 |
| 5,729,047 A | * | 3/1998 | Ma ............................. | 257/664 |
| 5,753,968 A | | 5/1998 | Bahl et al. | |
| 5,929,524 A | * | 7/1999 | Drynan et al. ............... | 257/758 |
| 6,046,503 A | * | 4/2000 | Weigand et al. ............ | 257/758 |
| 6,211,561 B1 | * | 4/2001 | Zhao .......................... | 257/522 |
| 6,277,730 B1 | * | 8/2001 | Yuasa et al. ................. | 438/627 |

FOREIGN PATENT DOCUMENTS

| | | |
|---|---|---|
| JP | 02-087701 | 3/1990 |
| JP | 03-041803 | 2/1991 |
| JP | 05-243804 | 9/1993 |
| JP | 05-323257 | 12/1993 |
| JP | 05-327325 | 12/1993 |
| JP | 07-249907 | 9/1995 |
| JP | 09-205306 | 8/1997 |
| JP | 09-298407 | 11/1997 |
| JP | 10-079608 | 3/1998 |
| JP | 10-98301 | 4/1998 |
| JP | 10-242715 | 9/1998 |

OTHER PUBLICATIONS

Brandner, J. L., et al., "*Electrical Characterization of Polyhic, A High Density, High Frequency, Interconnection and Packaging Medium For Digital Circuits*", 1989 Proceedings 39$^{th}$ Electronic Components Conference May 22–24, 1989 Houston, Texas, pp 759–764.

Tokumitsu, Tsuneo, et al., "*Multilayer MMIC Using a 3μm x 3–Layer Dielectric Film Structure*", 1990 IEEE MTT–S International Microwave Symposium digest vol. II, May 8–10, 1990 Dallas, Texas, pp. 831–834.

(List continued on next page.)

Primary Examiner—Eddie Lee
Assistant Examiner—Douglas W. Owens
(74) Attorney, Agent, or Firm—Nixon Peabody, LLP; Donald R. Studebaker

(57) ABSTRACT

A semiconductor device according to the present invention includes a line structure formed on a semiconductor substrate. The line structure includes: a conductor layer formed on the semiconductor substrate; a dielectric film formed on the conductor layer; and a conductor line formed on the dielectric film. The dielectric film includes: a first dielectric portion, at least part of the first dielectric portion being located between the lower surface of the conductor line and the upper surface of the conductor layer; and second and third dielectric portions laterally arranged to interpose the first dielectric portion therebetween. The dielectric constant of the first dielectric portion is different from at least one of the dielectric constants of the second and third dielectric portions.

13 Claims, 12 Drawing Sheets

OTHER PUBLICATIONS

European Search Report dated Jun. 28, 2000.

C.P. Wen, "Coplanar Waveguide: A Surface Strip Transmission Line Suitable for Nonreciprocal Gyromagnetic Device Applications", IEEE Transactions on Microwave Theory and Techniques, vol. MTT–17, No. 12, pp. 1087–1090, Dec., 1969.

R. Faraji–Dana et al., "The Current Distribution and AC Resistance of a Microstrip Structure", IEEE Transactions on Microwave Theory and Techniques, vol. 38, No. 9, pp. 1268–1277, Sep., 1990.

* cited by examiner

Fig. 1
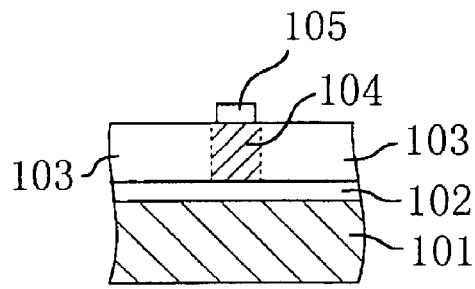
Fig. 2A
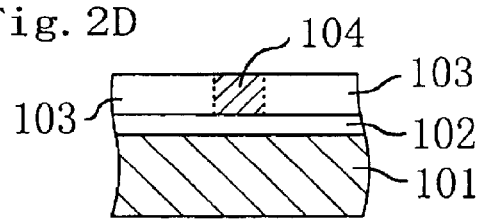
Fig. 2D
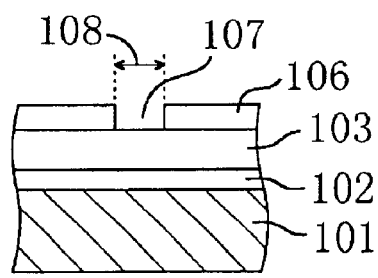
Fig. 2B
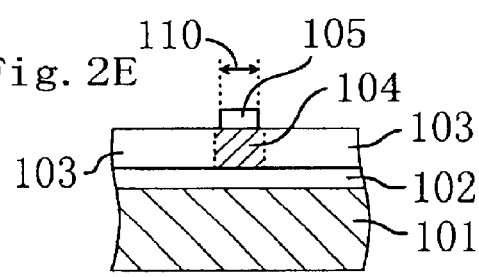
Fig. 2E
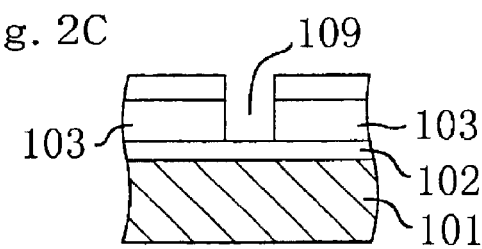
Fig. 2C
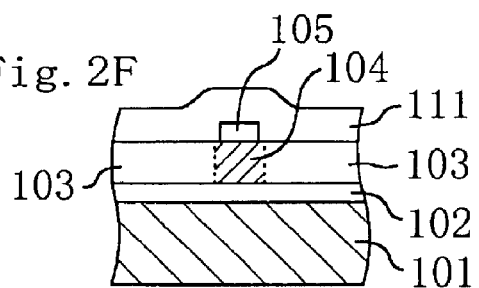
Fig. 2F L : Equivalent Inductance
R : Equivalent Resistance

PRIOR ART

PRIOR ART

PRIOR ART

PRIOR ART

SEMICONDUCTOR DEVICE

BACKGROUND OF THE INVENTION

The present invention generally relates to a microwave integrated circuit, and more particularly relates to a microstrip line structure for a semiconductor device operable at radio frequencies, which contributes to downsizing and performance enhancement of mobile communications unit terminals.

In recent years, the applications of mobile communications terminals of various types, including cellular phones and portable communications terminals, have been spanning a wider and wider range over the world. In Japan, cellular phones, operating on 900 MHz and 1.5 GHz bands, and personal handy phone systems (PHS), operating on 1.9 GHz band, have been popularized. Globally speaking, European GSM and DECT phones and American PCs phones are very popular.

Among these numerous types of mobile communications unit terminals, portable communications terminals, in particular, are required to be as small in size and as light in weight as possible. Thus, first of all, components for a portable communications terminal should have its size reduced and its performance enhanced. For example, to downsize a power amplifier for use in a radio-frequency transmitter for a portable communications terminal (hereinafter, simply referred to as an "RF power amplifier"), it is strongly needed to implement the RF power amplifier as a monolithic microwave IC (MMIC) of GaAs. In an MMIC, active components, matching circuit and bias supply are all integrated on a single chip. Thus, an MMIC can more effectively contribute to downsizing than a hybrid IC (HIC), in which matching circuit and bias supply are implemented as discrete chip components.

From a viewpoint of performance enhancement, however, an MMIC is said to be inferior to an HIC. This is because if an RF power amplifier is implemented as an MMIC, for instance, then parasitic resistive components, such as interconnection resistance, which are involved with semiconductor device processing for fabricating the MMIC, adversely increase, thus causing a considerable loss of the power to be transmitted. For that reason, a power amplifier implemented as an MMIC often results in lower power gain, lower power amplification and deteriorated distortion characteristic compared to a power amplifier implemented as an HIC. Thus, according to the currently available techniques, it is determined based on a necessary trade-off between downsizing and performance enhancement which part of a power amplifier should be implemented as an MMIC.

Hereinafter, an exemplary MMIC implementation of output matching circuit and drain-biasing circuit will be described with reference to FIGS. 10 through 15. An exemplary microstrip line structure will also be described with reference to FIG. 16. A microstrip line structure is a basic structure of a spiral inductor used as a passive component in the out-put matching circuit and drain-biasing circuit.

FIG. 10 illustrates a planar pattern for a final-stage MESFET and an output matching circuit thereof used for a high-output power amplifier transmitting a power of about 1 W. Following is respective parameters of the final-stage MESFET.

Unit finger length: 300 μm
Total gate width: 24 mm
Frequency: 900 MHz
Power supply voltage: 3.5 V
Saturated output power with idle current of 400 mA supplied: about 1.5 W
Operating current: about 550 mA
Gain: about 12 dB The gate of the MESFET 410 is connected to a gate-biasing pad 412 via a gate electrode extended line 411. The source of the MESFET 410 is connected to an MIM capacitor 409 via a source pad 413. The drain of the MESFET 410 is connected to a drain-biasing pad 415 via a drain extended line 414. One terminal of a spiral inductor 408 is connected to a part of the drain extended line 414, while the other terminal thereof is connected to an output pad 416 via the MIM capacitor 409.

The line of the spiral inductor 408 is made of gold plated to be about 3 μm thick. The extended lines thereof are formed by evaporating and depositing titanium and gold thereon. The upper-layer conductor of the MIM capacitor 409 is made of gold plated, while the lower-layer conductor thereof is formed by evaporating and depositing titanium and gold thereon. The interlayer dielectric film of the capacitor 409 is formed by depositing silicon nitride ($SiN_x$) with a dielectric constant of about 7 by a CVD process.

In the MMIC including the output matching circuit, the final-stage MESFET operates at a frequency of 900 MHz with a current of about 560 mA supplied. The MESFET provides a saturated output power of about 1.0 W with a power supply voltage of 3.5 V applied, and shows a gain of about 10 dB.

FIG. 11 illustrates an equivalent circuit of the MESFET and output matching circuit thereof shown in FIG. 10. A MESFET shown in FIG. 11, including gate 302, source 303 and drain terminals 304, corresponds to the MESFET 410 shown in FIG. 10. Equivalent series inductor 305, equivalent series resistor 306 and equivalent parallel capacitor 307 are connected to the drain terminal 304 of the MESFET. The equivalent series inductor 305 and resistor 306 form an equivalent circuit of the spiral inductor 408. In this example, the inductance value of the equivalent series inductor 305 is about 2.5 nH, the resistance value of the equivalent series resistor 306 is about 4 Ω and the capacitance value of the equivalent parallel capacitor 307 is about 12 pF. The equivalent parallel capacitor 307 corresponds to the MIM capacitor 409 shown in FIG. 10.

FIG. 12 illustrates a location of load impedance $Z_L$ 301 of the MESFET on a Smith chart showing impedance matching from a 50Ω line. The load impedance $Z_L$ 301 can be impedance-matched with the center of the Smith chart at 50Ω by tracing paths formed by the parallel capacitive components and series inductive components. In this case, the value of the load impedance $Z_L$ 301 is 7Ω+j4 Ω.

Next, a drain-biasing circuit and a MESFET, in which a drain choking inductor is implemented as a part of an MMIC, will be described with reference to FIG. 13. The choking inductor is a device used for preventing radio frequency power from leaking to the drain power supply.

Following is respective parameters of the MESFET.

Unit finger length: 100 μm
Total gate width: 1 mm
Frequency: 900 MHz
Power supply voltage: 3.5 V
Saturated output power with idle current of 20 mA supplied: about 120 mW
Operating current: about 23 mA
Gain: about 13 dB The gate of the MESFET 505 is connected to a gate-biasing pad 507 via a gate electrode extended line 506. The source of the MESFET 505 is connected to a source pad 508. The drain of the MESFET 505 is connected to a drain extended line 509. Part of the drain extended line 509 is connected to a drain-biasing pad 510 via a spiral inductor 504.

In the MMIC including the drain choking inductor, the MESFET operates at a frequency of 900 MHz and with a power supply voltage of 3.5 V applied and a current of about 19 mA supplied. The MESFET provides a saturated output power of about 90 mW with an idle current of 20 mA supplied, and shows a gain of about 11 dB.

The line of the spiral inductor 504 is made of gold plated to be about 3 μm thick. The extended lines thereof are formed by evaporating and depositing titanium and gold thereon.

FIG. 14 illustrates an equivalent circuit of the MESFET 505 and the drain-biasing circuit shown in FIG. 13. An equivalent series inductor 502 and an equivalent series resistor 503 constitute an equivalent circuit of the spiral inductor 504 shown in FIG. 13. In this example, the inductance value of the equivalent series inductor L 502 is 21 nH and the resistance value of the equivalent series resistor R 503 is 7.5 Ω.

FIG. 15 illustrates the location of choke impedance $Z_c$ 501 on a Smith chart. The choke impedance is located at a drain terminal of the MESFET, which is short-circuited at an end through which a drain voltage is applied. Usually, the choke impedance $Z_c$ 501 is ideally defined to be open. But since the choke impedance is sometimes used as a matching circuit in practice, the choke impedance is not necessarily open. In the example shown in FIG. 15, the choke impedance $Z_c$ 501 is located at an angle of phase rotation of about 140 degrees. FIG.

FIG. 16 illustrates the cross section of a microstrip line structure, which is a basic structure of a spiral inductor. As described above, a spiral inductor is used as a passive component for an output matching circuit or a drain-biasing circuit. Such a line structure includes: a line 602 formed on the surface of a GaAs substrate 601; and a grounded conductor 603 formed on the back of the GaAs substrate 601. The line 602 may be made of gold plated to be about 3 μm thick, for example.

In the first prior art example illustrated in FIGS. 10 through 12, the output impedance of the final-stage GaAs FET used as a power amplifier is as low as about 10 Ω or less. Accordingly, the resistive components of the output matching circuit, including the interconnection resistance of the spiral inductor formed on the GaAs substrate, increases the power lost by the output matching circuit. As a result, the power amplifier shows lower gain, lower power amplification (corresponding to operating current) and deteriorated distortion characteristic. In order to avoid problems such as these, the thickness or width of a line may be increased. However, the thickness of a line cannot exceed a certain upper limit defined by various restrictions on semiconductor device processing. Also, the wider a line, the larger the area occupied by the line on a chip, which is contradictory to the demand of downsizing.

Even in a medium-output power amplifier transmitting a power of about 100 W, the input, interstage and output matching circuits thereof are included in an MMIC. In such a case, the output matching circuit is built in an MMIC, in which the output impedance of a final-stage GaAs FET used for the power amplifier is as high as approximately 300Ω or more. Even so, the resistive components of the output matching circuit, including the interconnection resistance of the spiral inductor formed on the GaAs substrate, increases the power lost by the output matching circuit, thus adversely affecting the performance thereof.

In the second prior art example shown in FIGS. 13 through 15, since the drain-biasing circuit is implemented as a part of an MMIC, the choking spiral inductor occupies a larger area on a GaAs substrate, thus increasing the area of the MMIC chip and interfering with downsizing. Furthermore, a drain voltage externally applied drops due to the parasitic resistance of the spiral inductor line, resulting in deterioration in performance of the power amplifier. Accordingly, the second prior art example cannot make full use of the essential characteristics of the power amplifier, and cannot sufficiently contribute to the performance enhancement thereof.

SUMMARY OF THE INVENTION

An object of the present invention is providing a semiconductor device operable at radio frequencies, which can contribute to both downsizing and performance enhancement of mobile communications terminals.

A semiconductor device according to the present invention has a line structure formed on a semiconductor substrate. The line structure includes: a conductor layer formed on the semiconductor substrate; a dielectric film formed on the conductor layer; and a conductor line formed on the dielectric film. The dielectric film includes: a first dielectric portion, at least part of the first dielectric portion being located between the lower surface of the conductor line and the upper surface of the conductor layer; and second and third dielectric portions laterally arranged to interpose the first dielectric portion therebetween. The dielectric constant of the first dielectric portion is different from at least one of the dielectric constants of the second and third dielectric portions.

In one embodiment of the present invention, the dielectric constant of the first dielectric portion may be lower than those of the second and third dielectric portions.

In another embodiment of the present invention, at least one of the dielectric constants of the second and third dielectric portions may be higher than 10.

In still another embodiment, the device may further include another dielectric film covering the conductor line.

Another semiconductor device according to the present invention also has a line structure formed on a semiconductor substrate. The line structure includes: a conductor layer formed on the semiconductor substrate; a dielectric film formed on the conductor layer; and a conductor line formed on the dielectric film. The dielectric film includes two or more dielectric layers with mutually different dielectric constants.

In one embodiment of the present invention, at least one of the two or more dielectric layers may include: a first dielectric portion, at least part of the first dielectric portion being located between the lower surface of the conductor line and the upper surface of the conductor layer; and second and third dielectric portions laterally arranged to interpose the first dielectric portion therebetween. The dielectric constant of the first dielectric portion may be different from at least one of the dielectric constants of the second and third dielectric portions.

In another embodiment of the present invention, at least one of the two or more dielectric layers has preferably been patterned.

Still another semiconductor device according to the present invention also has a line structure formed on a semiconductor substrate. The line structure includes: a conductor layer formed on the semiconductor substrate; a first dielectric film formed on the conductor layer; a conductor line formed on the first dielectric film; and a second dielectric film covering the conductor line.

In one embodiment of the present invention, the first dielectric film may include two or more dielectric layers with mutually different dielectric constants.

Yet another semiconductor device according to the present invention also has a line structure formed on a semiconductor substrate. The line structure includes: a conductor layer formed on the semiconductor substrate; a dielectric film formed on the conductor layer; and a conductor line formed on the dielectric film. A region of the conductor layer, which is located under the conductor line, has been removed at least partially.

In one embodiment of the present invention, the dielectric film may include two or more dielectric layers with mutually different dielectric constants.

In another embodiment of the present invention, the device may further include a second dielectric film covering the conductor line.

In still another embodiment, the dielectric constant of the second dielectric film may be higher than 10.

Yet another semiconductor device according to the present invention also has a line structure formed on a semiconductor substrate. The line structure includes: a coplanar conductor layer formed over the semiconductor substrate; and a dielectric film formed on the coplanar conductor layer. The coplanar conductor layer includes: a grounded conductor layer; and a conductor line spaced apart from the grounded conductor layer. The dielectric constant of the dielectric film is higher than 10.

In one embodiment of the present invention, a dielectric with a dielectric constant equal to or smaller than 10 may exist between the grounded conductor layer and the conductor line.

Yet another semiconductor device according to the present invention also has a line structure formed on a semiconductor substrate. The line structure includes: a first dielectric film formed on the semiconductor substrate; a coplanar conductor layer formed on the first dielectric film; and a second dielectric film formed on the coplanar conductor layer.

In one embodiment of the present invention, the dielectric constant of at least one of the first and second dielectric films may be higher than 10.

In another embodiment of the present invention, the first dielectric film may include two or more dielectric layers with mutually different dielectric constants.

In still another embodiment, the device may further include an active component operable at radio frequencies, the active component being formed on the semiconductor substrate and electrically connected to the line structure.

According to the present invention, the equivalent dielectric constant of a dielectric film can be optimized. In addition, the line length of a spiral inductor, which is required for matching the impedance of an active component with a desired load impedance or attaining a desired choke inductance, can be shortened, thus reducing the parasitic resistive components involved with the spiral inductor. As a result, it is possible to provide a semiconductor device operable at radio frequencies and contributing to both downsizing and performance enhancement of mobile communications unit terminals.

BRIEF DESCRIPTION OF THE DRAWINGS

FIG. 1 is a cross-sectional view of a line structure for a semiconductor device according to a first embodiment of the present invention.

FIGS. 2A, 2B, 2C, 2D, 2E and 2F are cross-sectional views illustrating respective process steps for forming the line structure of the first embodiment.

DESCRIPTION OF THE PREFERRED EMBODIMENTS

Hereinafter, preferred embodiments of a semiconductor device according to the present invention will be described with reference to the accompanying drawings.

Embodiment 1

A first exemplary embodiment of a semiconductor device according to the present invention will be described with reference to FIGS. 1 through 3.

FIG. 1 illustrates the cross section of a novel microstrip line structure or a waveguide applicable to the semiconductor device of the present invention. As shown in FIG. 1, this line structure includes: a grounded conductor layer 102 made up of plural pairs of titanium and gold layers alternately stacked to be about 0.7 μm thick on the surface of a GaAs substrate 101; and a gold-plated line (conductor line) 105 provided over the grounded conductor layer 102 to be spaced apart therefrom. A dielectric film (thickness: about 0.1 μm to about 2 μm) is formed on the grounded conductor layer 102. The dielectric film includes: a strontium titanate (SrTiO$_3$ or STO) layer 103; and a dielectric 104 of silicon nitride (SiN$_x$). In this embodiment, the SiN$_x$ dielectric 104 is approximately as thick as the strontium titanate layer 103, is in contact with the lower surface of the line 105 and is located in a region between the lower surface of the line 105 and the upper surface of the grounded conductor layer 102. In other words, the SiN$_x$ dielectric 104 is laterally sandwiched by the strontium titanate layer 103. The dielectric constant of the SiN$_x$ dielectric 104 is in the range from about 6 to about 7, which is much lower than that of the strontium titanate layer 103 in the range from about 50 to about 200.

Figure 10:
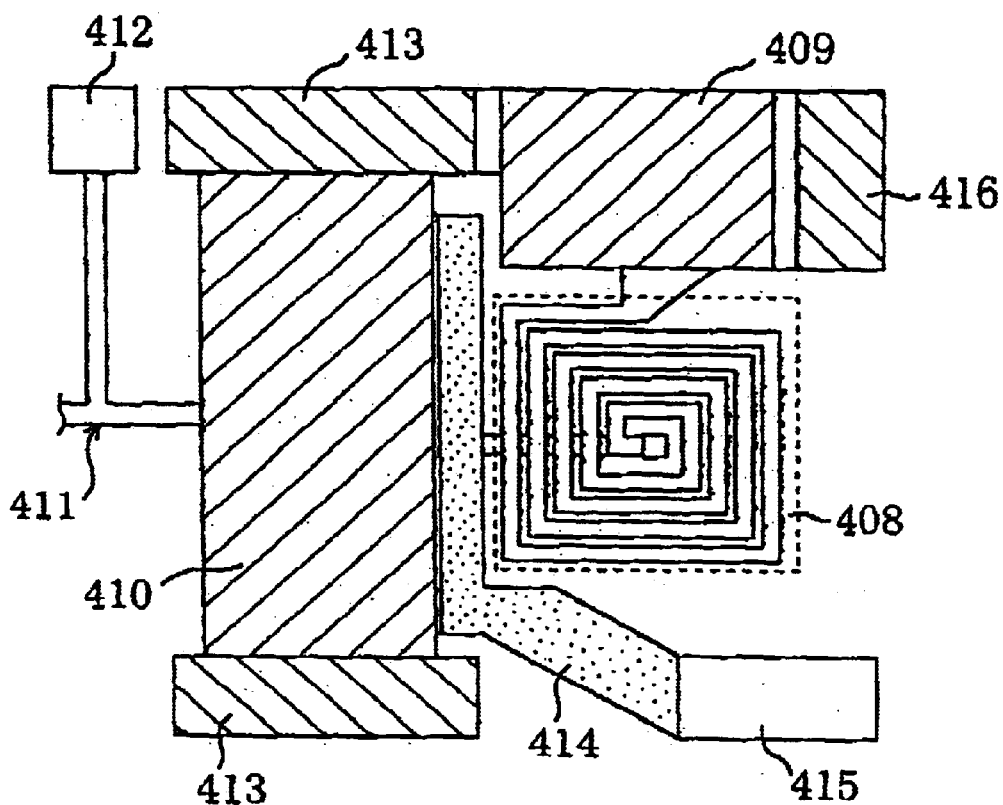
FIG. 10 is a plan view illustrating a final-stage MESFET and an output matching circuit thereof used for a high-output power amplifier transmitting a power of about 1 W.
Figure 11:
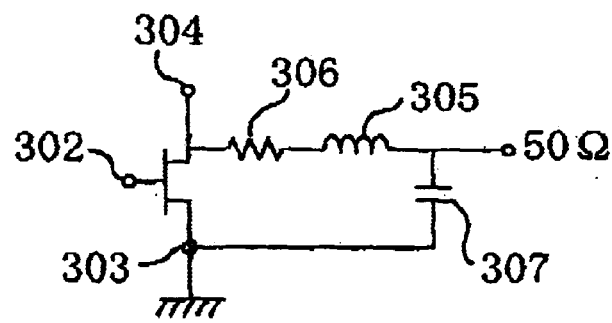
FIG. 11 is an equivalent circuit diagram of the MESFET and output matching circuit thereof shown in FIG. 10.
Figure 12:
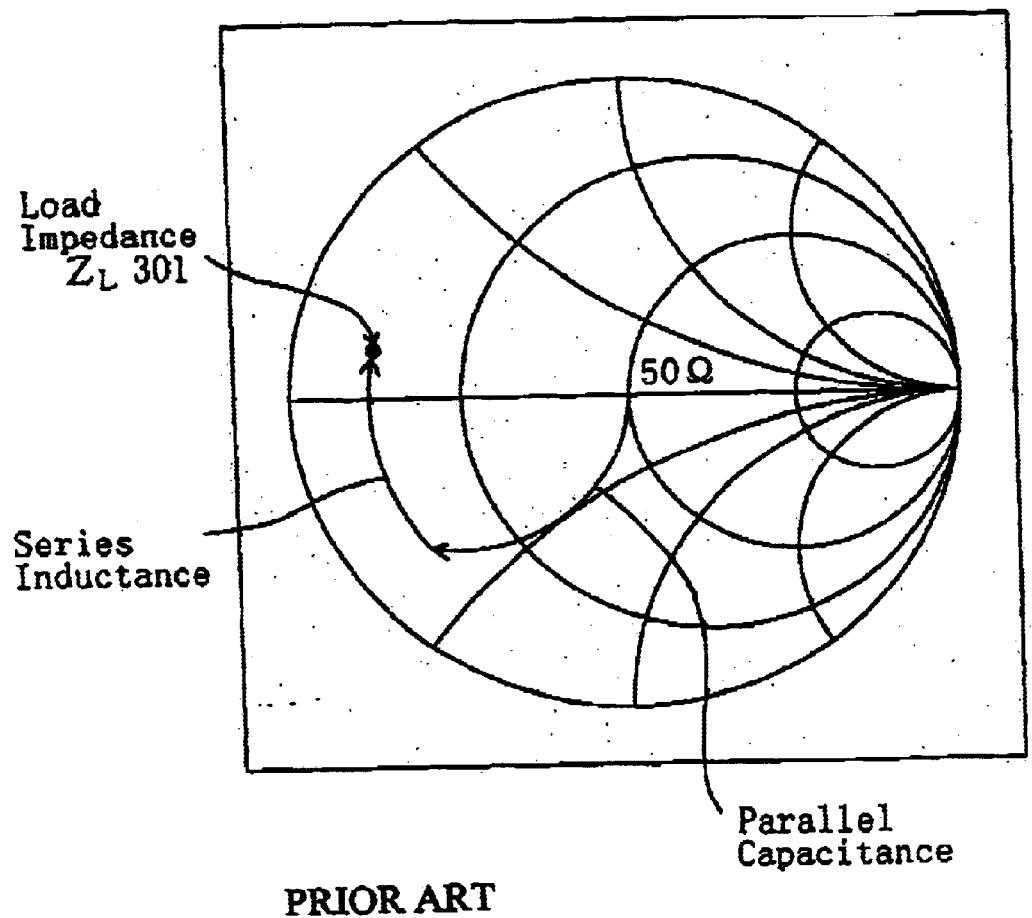
FIG. 12 is a Smith chart illustrating a location of load impedance $Z_L$ 301 of the MESFET shown in FIG. 11 and showing impedance matching from a 50Ω line.

An active component operable at radio frequencies (hereinafter, simply referred to as an "RF active component"), like a MESFET as described in the background section, is actually formed on the GaAs substrate 101, but is not shown in FIG. 1 for the sake of simplicity. The line structure shown in FIG. 1 is used for forming the spiral inductor shown in FIG. 10 or 13, and is electrically connected to the RF active component and so on.

Hereinafter, a method for forming the line structure will be described with reference to FIGS. 2A through 2F.

First, as shown in FIG. 2A, the grounded conductor layer 102, made up of titanium and gold layers alternately stacked, is deposited on the GaAs substrate 101 by a thin film deposition technique like evaporation. The thickness of the grounded conductor layer 102 is defined within the range from 0.5 μm to 3 μm. The grounded conductor layer 102 is not necessarily made of titanium and gold, but may be made of platinum (Pt) and tungsten silicon nitride (WSiN).

Next, as shown in FIG. 2B, the strontium titanate layer 103 with a dielectric constant of about 100 is deposited by RF sputtering to be about 1.5 μm thick on the grounded conductor layer 102. Thereafter, a resist 106 is applied onto the strontium titanate layer 103, and then exposed to radiation and developed by a photolithographic process, thereby providing an opening 107 in the resist 106. The width 108 of the opening 107 may be about 10 μm. The planar layout of the opening 107 is defined so as to correspond to that of the line 105 to be formed during a subsequent process step.

Then, as shown in FIG. 2C, portion of the strontium titanate layer 103, which is exposed inside the opening 107, is etched away by an ion milling technique, for example, to form a recess (opening) 109 in the strontium titanate layer 103. The width of the recess 109 is substantially equal to the width 108 of the opening 107. This etching process is performed so as to expose the surface of the grounded conductor layer 102 at the bottom of the recess 109.

Subsequently, as shown in FIG. 2D, a silicon nitride portion (SiN$_x$ dielectric) 104 (with a dielectric constant of about 7 in this embodiment) is formed to be about 1.5 μm thick within the recess 109 of the strontium titanate layer 103 by a thin film deposition technique such as a plasma CVD process. The silicon nitride portion 104 may be formed by a lift-off technique, for example.

Thereafter, as shown in FIG. 2E, the gold-plated line 105 is formed on the dielectric 104. In this embodiment, the thickness of the line 105 is 3 μm, the width 110 thereof is 15 μm, and the centerline of the SiN$_x$ dielectric 104 is substantially aligned with that of the line 105. It should be noted that the centerline of the SiN$_x$ dielectric 104 does not have to be aligned with that of the line 105. That is to say, the line 105 may partially overlap with the SiN$_x$ dielectric 104 in the planar layout. In such a case, since the equivalent dielectric constant of the dielectric film is set at an appropriate level, the length of the line required for realizing desired impedance matching can be considerably shortened.

Figure 3A:
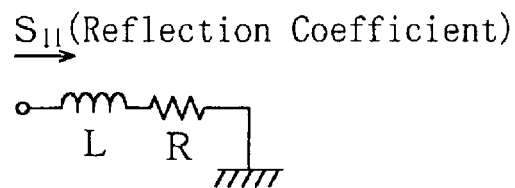
FIG. 3A illustrates an equivalent circuit of the line structure of the first embodiment.
Figure 3B:
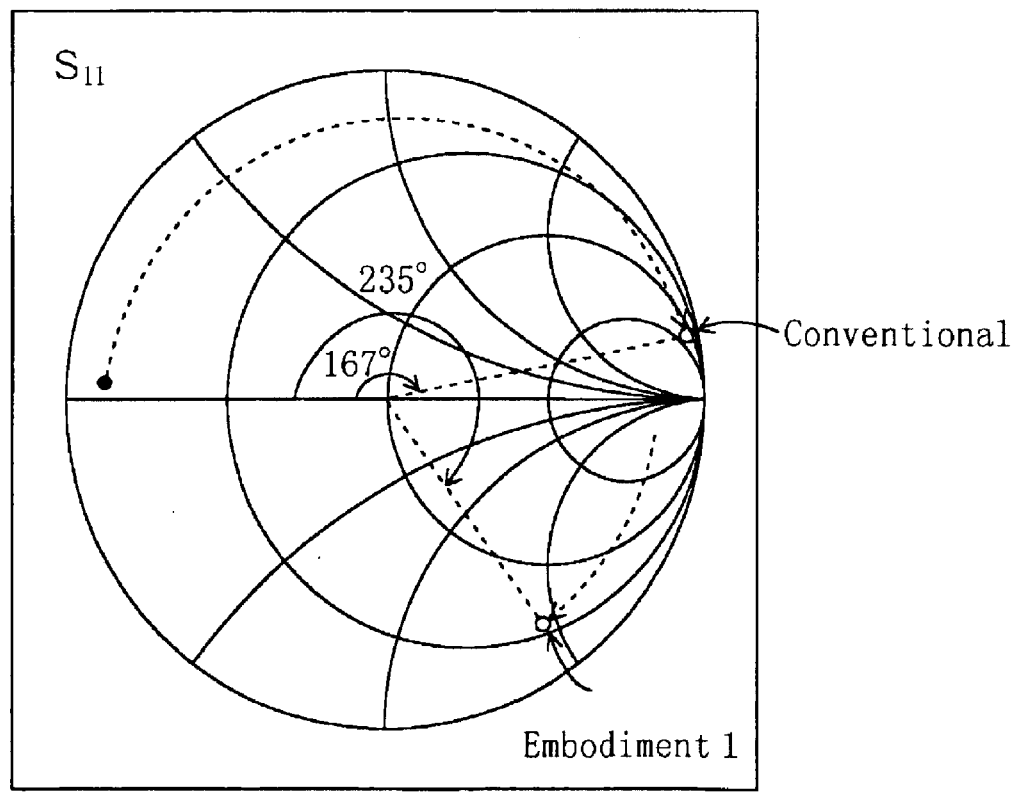
FIG. 3B is a Smith chart illustrating respective angles of phase rotation for a microstrip line with the structure shown in FIG. 1 and a conventional line structure shown in FIG. 16.
Figure 13:
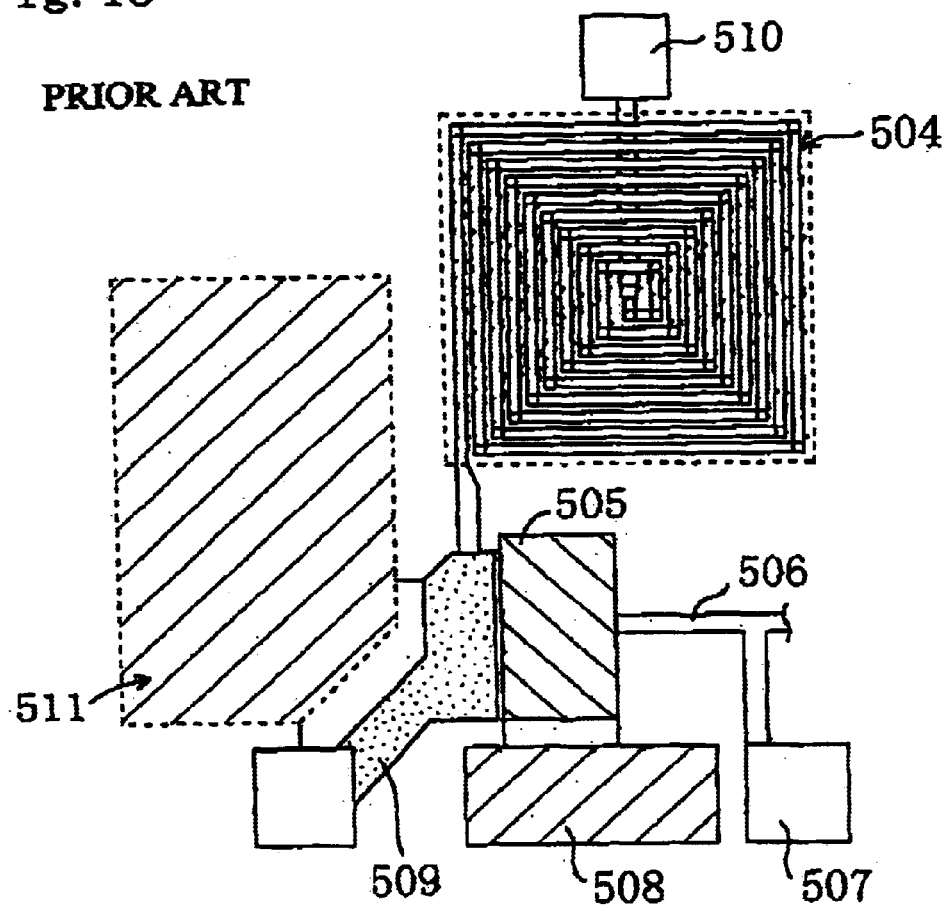
FIG. 13 is a plan view illustrating a MESFET and a drain-biasing circuit thereof.
Figure 14:
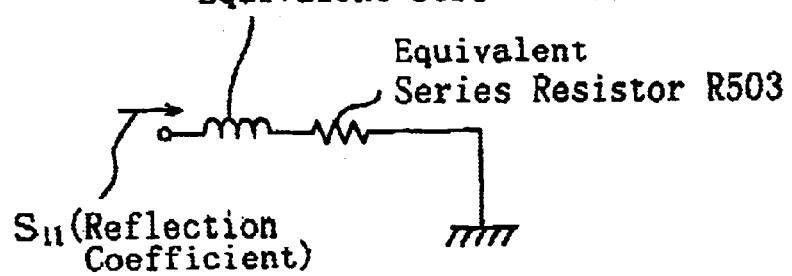
FIG. 14 is an equivalent circuit diagram of the MESFET and drain-biasing circuit thereof shown in FIG. 13.
Figure 15:
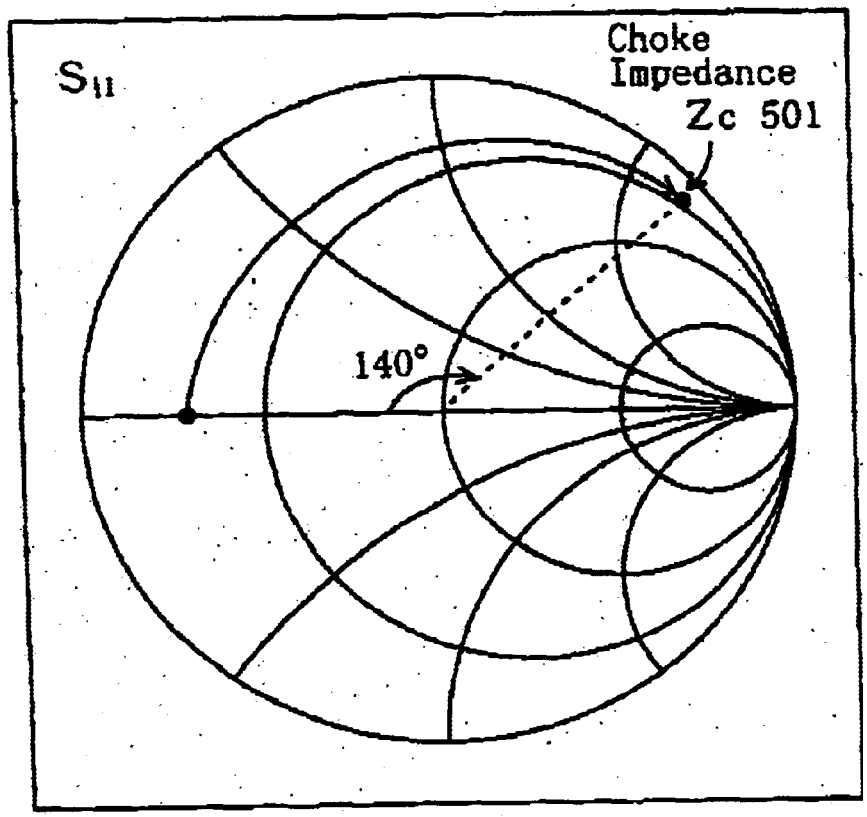
FIG. 15 is a Smith chart illustrating the location of choke impedance $Z_c$ 501 at a drain terminal of the MESFET, which is short-circuited at an end through which a drain voltage is applied.

FIG. 3A illustrates an equivalent circuit diagram where a spiral inductor such as that shown in FIG. 13 is formed to have the line structure just described. FIG. 3B illustrates respective angles of phase rotation for a microstrip line with the structure just described and for the conventional microstrip line structure shown in FIG. 16 (hereinafter, simply referred to as a "conventional structure"). In the example illustrated in FIG. 3B, the lengths of these two types of lines are supposed to be equal to each other. Each of these angles of phase rotation represents a phase angle of an associated line on a Smith chart, where the far end of the line is short-circuited. And each angle can be used as an index for estimating a length of a line required for attaining desired impedance matching. More specifically, the larger the angle of phase rotation of a line, the shorter that portion of the line required for realizing desired impedance matching. As can be seen from FIG. 3B, the angle of phase rotation of the line structure according to this embodiment is about 68 degrees larger than that of the conventional structure of the same length. Thus, according to the present invention, the required line length can be shortened compared to the conventional structure. This is because the equivalent dielectric constant of the dielectric film can be optimized by making up the dielectric film of plural parts with mutually different dielectric constants.

Such effects are attained because a capacitance formed between the grounded conductor layer 102 and the conductor line 105 is reduced and because the electrical length does not increase according to the present invention. The capacitance can be reduced by providing a first dielectric portion made of a material with a lower dielectric constant between the grounded conductor layer 102 and conductor line 105. On the other hand, the increase in electrical length can be suppressed by interposing the first dielectric portion between a pair of other dielectric portions with higher dielectric constants. Also, the reduction in capacitance contributes to increasing the characteristic impedance $Z_o$, thus shortening the required line length.

By using such a line structure, the line length of a spiral inductor required for matching the impedance of an active component with a desired load impedance or attaining a desired choke inductance can be shortened, thus reducing the parasitic resistive components involved with the spiral inductor. As a result, it is possible to provide a semiconductor device operable at radio frequencies and contributing to both downsizing and performance enhancement of mobile communications unit terminals.

It should be noted that if another strontium titanate film 111 is deposited to cover the strontium titanate layer 103 and the line 105 as shown in FIG. 2F, then the angle of phase rotation can be further increased. This is because the electrical length can be further shortened by covering the line with a dielectric film having a high dielectric constant.

At least half of the strontium titanate layer 103, sandwiching the SiN$_x$ dielectric 104 on right- and left-hand sides, preferably has a dielectric constant higher than 10. This is because the electrical length can be drastically reduced by setting the dielectric constant of that portion at 10 or more. Examples of such films with high dielectric constants include a barium strontium titanate (BST) film, as well as a strontium titanate film.

Also, the dielectric film may have a multilayer structure including a first dielectric layer and a second dielectric layer formed on the first dielectric layer. In such a case, the dielectric constant of the first dielectric layer may be either higher or lower than that of the second dielectric layer. By employing this multilayer structure, the equivalent dielectric constant of the dielectric film can be controlled at an appropriate value. Furthermore, after an opening has been provided only in the second dielectric layer, the opening may be filled in with a dielectric having a dielectric constant different from that of the second dielectric layer, and a line may be formed to overlap with the buried dielectric. For example, an opening may be formed only in a second dielectric layer of strontium titanate and then filled in with silicon nitride. In such a case, the equivalent dielectric constant of the dielectric film can be controlled at a desired level even more easily.

Figure 17A:
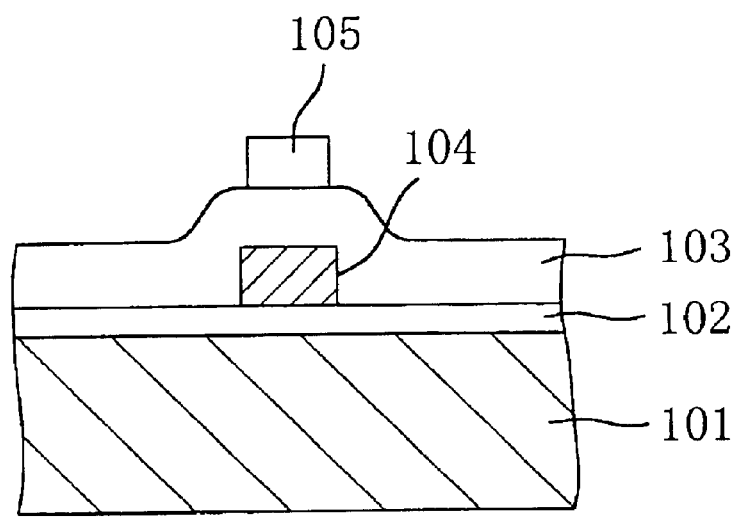
FIGS. 17A and 17B are cross sectional views of alternative line structures for a semiconductor device according to a first embodiment of the present invention.
Figure 17B:
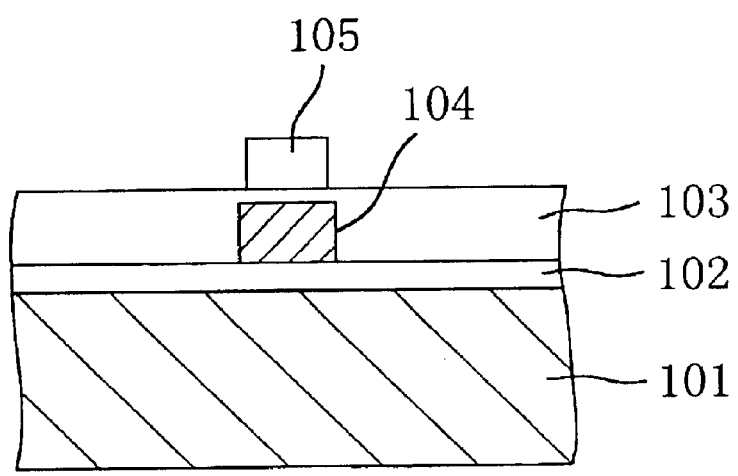

FIGS. 17A and 17B illustrate modified examples of this embodiment.

Like the structure shown in FIG. 1, the structure shown in FIG. 17A also includes: the grounded conductor layer 102 made up of plural pairs of titanium and gold layers alternately stacked to be about 0.7 $\mu$m thick on the surface of the GaAs substrate 101; and the gold-plated line (conductor line) 105 provided over the grounded conductor layer 102 to be spaced apart therefrom. The structure shown in FIG. 17A further includes; a patterned silicon nitride (SiN$_x$) portion 104 formed on the grounded conductor layer 102; and a strontium titanate (SrTiO$_3$ or STO) layer 103 covering the SiN$_x$ portion 104.

In this modified example, the patterned silicon nitride (SiN$_x$) portion 104 is formed first, and then the strontium titanate (SrTiO$_3$ or STO) layer 103 is deposited over the substrate 101.

In the example shown in FIG. 17B, the patterned silicon nitride (SiN$_x$) portion 104 is formed on the grounded conductor layer 102, and then the strontium titanate (SrTiO$_3$ or STO) layer 103 is deposited over the substrate 101 to cover the SiN$_x$ portion 104 as in the structure shown in FIG. 17A. However, in the example shown in FIG. 17B, the strontium titanate (SrTiO$_3$ or STO) layer 103 has its upper surface planarized after having been deposited over the substrate 101.

According to these modified examples, the line length of the spiral inductor or the like can also be shortened as in the embodiment shown in FIG. 1. As a result, the parasitic resistive components can also be reduced.

Embodiment 2

A second exemplary embodiment of a semiconductor device according to the present invention will be described with reference to FIGS. 4 through 6.

Figure 4:
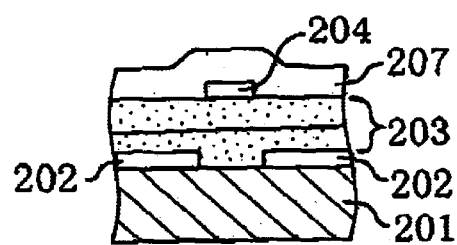
FIG. 4 is a cross-sectional view of a line structure for a semiconductor device according to a second embodiment of the present invention.

FIG. 4 illustrates the cross section of a novel line structure applicable to the semiconductor device of the present invention. As shown in FIG. 4, this line structure includes: a grounded conductor layer 202 made up of plural pairs of titanium and gold layers alternately stacked to be about 0.7 $\mu$m thick on the surface of a GaAs substrate 201; and a gold-plated line 204 provided over the grounded conductor layer 202 to be spaced apart therefrom. A strontium titanate layer (thickness: about 0.1 $\mu$m to about 2 $\mu$m) 203 is formed on the grounded conductor layer 202. A portion of the grounded conductor layer 202 just under the line 204 has been removed, which is totally different from the line structure of the first embodiment. An RF active component, like a MESFET as described in the background section, is actually formed on the GaAs substrate 101, but is not shown in FIG. 4 for the sake of simplicity.

Hereinafter, a method for forming the line structure will be described with reference to FIGS. 5A through 5D.

Figure 5A:
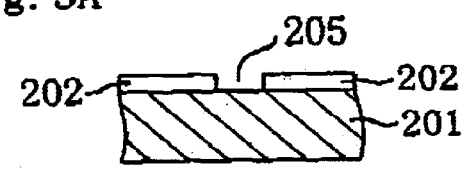
FIGS. 5A, 5B, 5C and 5D are cross-sectional views illustrating respective process steps for forming the line structure of the second embodiment.

First, as shown in FIG. 5A, the grounded conductor layer 202, made up of titanium and gold layers alternately stacked, is deposited on the GaAs substrate 201 by a thin film deposition technique like evaporation. Then, part of the grounded conductor layer 202, which is located just under the region where the line 204 is to be formed, is etched away. To shape the grounded conductor layer 202 into such a pattern, a resist pattern (not shown) may be defined on the grounded conductor layer 202 and then a portion of the grounded conductor layer 202, which is not covered with the resist pattern, may be removed by an ion milling technique, for example. In this manner, an opening 205 with a width of about 10 $\mu$m is provided in the grounded conductor layer 202. The thickness of the grounded conductor layer 202 is defined within the range from about 0.5 $\mu$m to about 3 $\mu$m. The grounded conductor layer 202 is not necessarily made of titanium and gold, but may be made of platinum (Pt) and tungsten silicon nitride (WSiN).

Figure 5C:
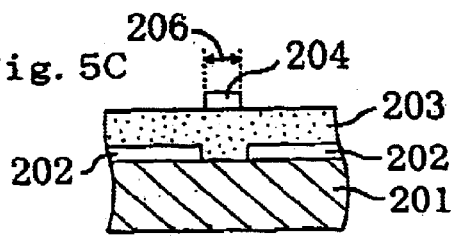
Figure 5B:
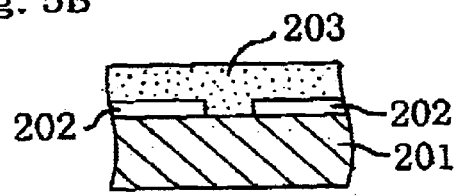

Next, as shown in FIG. 5B, the first strontium titanate layer 203 with a dielectric constant of about 100 is deposited by RF sputtering to be about 1.5 $\mu$m thick on the grounded conductor layer 202.

Thereafter, as shown in FIG. 5C, the gold-plated line 204 is formed on the first strontium titanate layer 203. In this embodiment, the thickness of the line 204 is 3 $\mu$m, the width 206 thereof is 15 $\mu$m, and the centerline of the region where the grounded conductor layer 202 does not exist (i.e., the opening 205) is substantially aligned with that of the line 204.

Figure 5D:
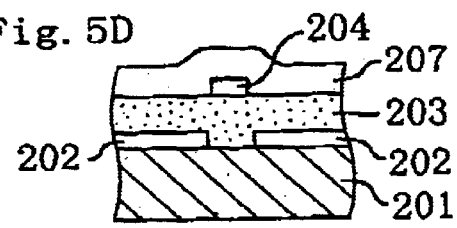

Subsequently, as shown in FIG. 5D, the second strontium titanate layer 207 is deposited over the first strontium titanate layer 203 to cover the line 204.

Figure 6:
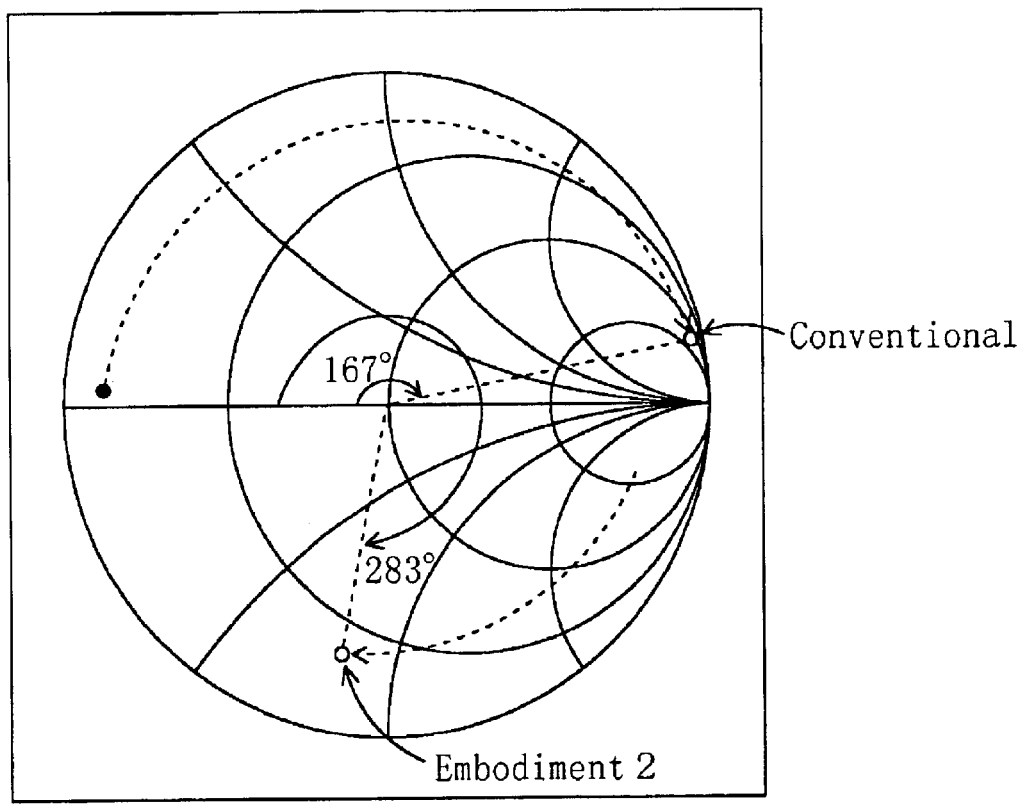
FIG. 6 is a Smith chart illustrating respective angles of phase rotation for a microstrip line with the structure shown in FIG. 4 and the conventional line structure shown in FIG. 16.
Figure 16:
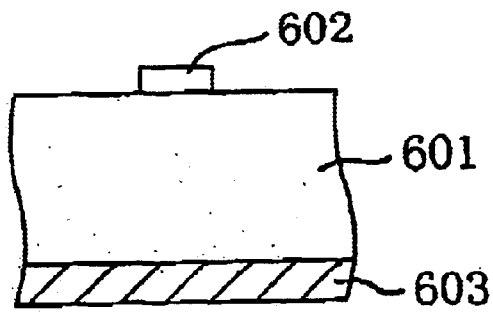
FIG. 16 is a cross-sectional view illustrating a microstrip line structure, which is a basic structure of a conventional spiral inductor.

FIG. 6 illustrates respective angles of phase rotation for a microstrip line with the structure just described and for the conventional structure shown in FIG. 16. In the example illustrated in FIG. 6, the lengths of these two types of lines are supposed to be equal to each other. Each of these angles of phase rotation represents a phase angle of an associated line on a Smith chart, where the far end of the line is short-circuited. And the angle can be used as an index for estimating a line length required for attaining desired impedance matching. More specifically, the larger the angle of phase rotation of a line, the shorter that portion of the line required for realizing desired impedance matching. As can be seen from FIG. 6, the angle of phase rotation of the line structure according to this embodiment is about 116 degrees larger than that of the conventional structure of the same length. Accordingly, the line length can be shortened according to the present invention compared to the conventional structure. This is because the conventional structure requires a line length, which is longer than that required by the inventive structure by a quantity corresponding to the angle of phase rotation of 116 degrees, for attaining desired impedance matching.

By using such a line structure, the line length of a spiral inductor required for matching the impedance of an active component with a desired load impedance or attaining a desired choke inductance can be shortened, thus reducing the parasitic resistive components involved with the spiral inductor. As a result, it is possible to provide a semiconductor device operable at radio frequencies and contributing to both downsizing and performance enhancement of mobile communications unit terminals.

The second strontium titanate layer 207, covering the line 204, preferably has a dielectric constant higher than 10. This is because the electrical length can be reduced even more drastically by covering the line with a film having a high dielectric constant. Examples of such films with high dielectric constants include a BST film, as well as a strontium titanate film.

Also, the dielectric film provided between the grounded conductor layer 202 and the line 204 may have a multilayer structure including a first dielectric layer and a second dielectric layer formed on the first dielectric layer. In such a case, the dielectric constant of the first dielectric layer may be either higher or lower than that of the second dielectric layer.

Embodiment 3

A third exemplary embodiment of a semiconductor device according to the present invention will be described with reference to FIGS. 7 through 9.

Figure 7:
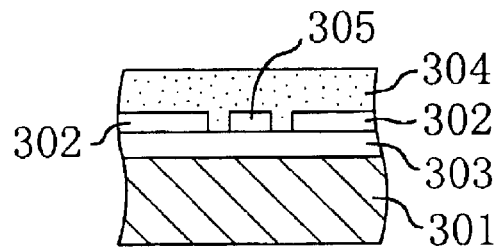
FIG. 7 is a cross-sectional view of a line structure for a semiconductor device according to a third embodiment of the present invention.

FIG. 7 illustrates the cross section of a novel line structure applicable to the semiconductor device of the present invention. As shown in FIG. 7, this line structure includes: a first strontium titanate layer 303 formed on the surface of a GaAs substrate 301; a grounded conductor layer 302 and a line 305, which are both made of gold plated to be about 0.7 μm thick on the first strontium titanate layer 303; and a second strontium titanate layer 304 formed to cover the grounded conductor layer 302 and the line 305. In this specification, the combination of the grounded conductor layer 302 and the line 305 will be called a "coplanar structure". A gap is provided between the line 305 and the grounded conductor layer 302.

An RF active component, like a MESFET as described in the background section, is actually formed on the GaAs substrate 301, but is not shown in FIG. 7 for the sake of simplicity.

Hereinafter, a method for forming the line structure will be described with reference to FIGS. 8A through 8C.

Figure 8A:
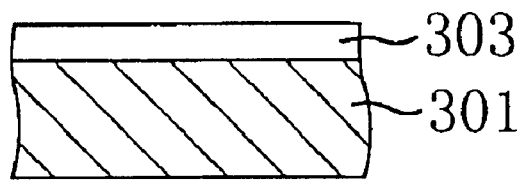
FIGS. 8A, 8B and 8C are cross-sectional views illustrating respective process steps for forming the line structure of the third embodiment.

First, as shown in FIG. 8A, the strontium titanate layer 303 with a dielectric constant of about 100 is deposited by RF sputtering to be about 1.5 μm thick on the GaAs substrate 301.

Figure 8B:
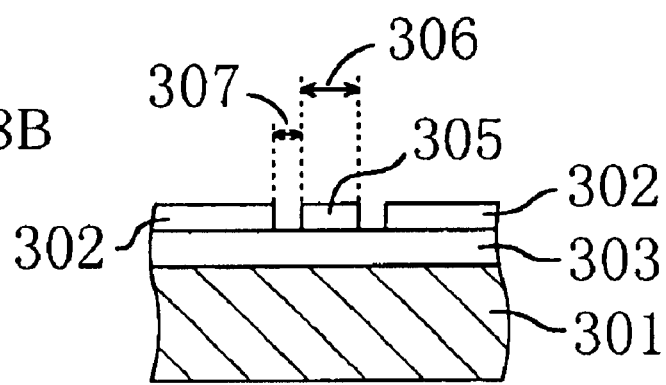

Next, as shown in FIG. 8B, a conductor film, made up of titanium and gold layers alternately stacked, is deposited to be about 3 μm thick on the strontium titanate layer 303 by a thin film deposition technique like evaporation. The thickness of the conductor film is defined within the range from about 0.5 μm to about 6 μm, for example. Then, the conductor film is patterned by lithography and etching processes, thereby forming the grounded conductor layer 302 and the line 305 at the same time. In this embodiment, the width 306 of the line 305 is defined at about 15 μm, and the width of the space 307 between the line 305 and the grounded conductor layer 302 is also defined at about 15 μm. The material of the conductor film is not limited to titanium and gold, but may be plated gold or aluminum (Al). The width of the space 307 is not necessarily 15 μm, but may be appropriately selected within the range from about 5 μm to about 100 μm.

Figure 8C:
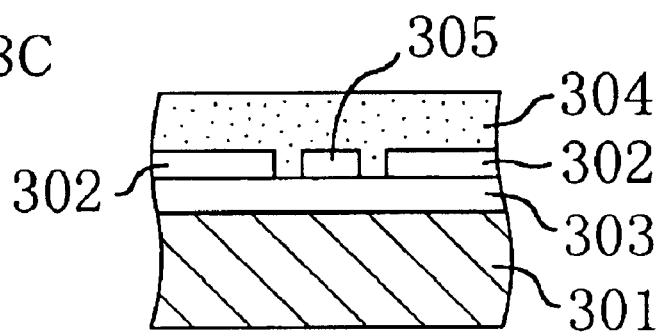

Subsequently, as shown in FIG. 8C, the strontium titanate layer 304 with a dielectric constant of about 100 is deposited by RF sputtering to be about 1.5 μm thick and to cover the grounded conductor layer 302 and the line 305.

Figure 9:
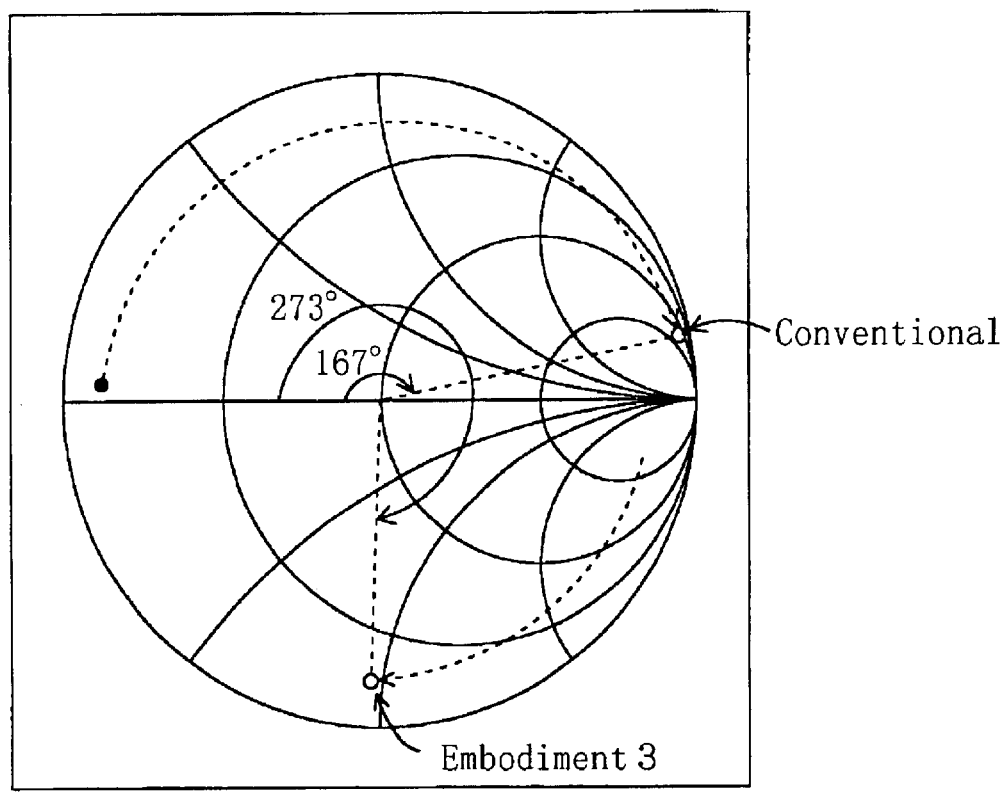
FIG. 9 is a Smith chart illustrating respective angles of phase rotation for a microstrip line with the structure shown in FIG. 7 and the conventional line structure shown in FIG. 16.

FIG. 9 illustrates respective angles of phase rotation for a microstrip line with the structure just described and for the conventional structure shown in FIG. 16. In the example illustrated in FIG. 9, the lengths of these two types of lines are supposed to be equal to each other. Each of these angles of phase rotation represents a phase angle of an associated line on a Smith chart, where the far end of the line is short-circuited. And each angle can be used as an index for estimating a line length required for attaining desired impedance matching. More specifically, the larger the angle of phase rotation of a line, the shorter that portion of the line required for realizing desired impedance matching. As can be seen from FIG. 9, the angle of phase rotation of the line structure according to this embodiment is about 106 degrees larger than that of the conventional structure of the same length. Accordingly, the line length can be shortened according to the present invention compared to the conventional structure.

By using such a line structure, the line length of a spiral inductor required for matching the impedance of an active component with a desired load impedance or attaining a desired choke inductance can be shortened, thus reducing the parasitic resistive components involved with the spiral inductor. As a result, it is possible to provide a semiconductor device operable at radio frequencies and contributing to both downsizing and performance enhancement of mobile communications unit terminals.

The first strontium titanate layer 303, provided between the grounded conductor layer 302 and the substrate 301 and between the line 305 and the substrate 301, and the second strontium titanate layer 304, covering the line 305 and the layer 302, preferably have a dielectric constant higher than 10. This is because the electrical length can be reduced even more drastically by covering the line with a dielectric film having a high dielectric constant. Examples of such films with high dielectric constants include a BST film, as well as a strontium titanate film.

Also, the first strontium titanate layer 303, provided between the grounded conductor layer 302 and the substrate 301 and between the line 305 and the substrate 301, may have a multilayer structure including a first dielectric layer and a second dielectric layer formed on the first dielectric layer. In such a case, the dielectric constant of the first dielectric layer may be either higher or lower than that of the second dielectric layer.

Embodiment 4

A fourth exemplary embodiment of a semiconductor device according to the present invention will be described with reference to FIG. 18.

Figure 18:
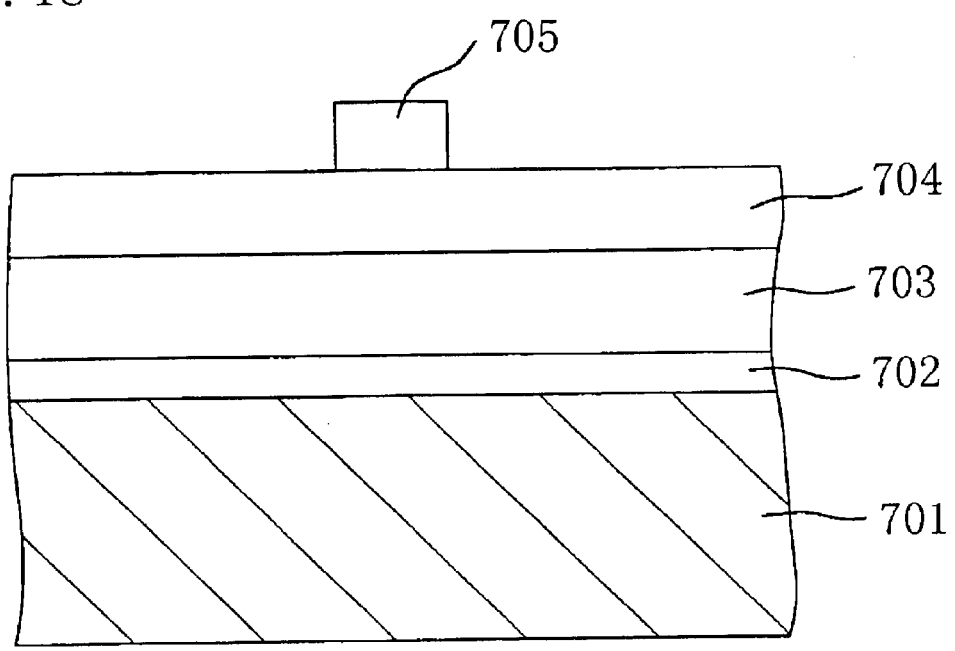
FIG. 18 is a cross-sectional view of a line structure for a semiconductor device according to a fourth embodiment of the present invention.

FIG. 18 illustrates the cross section of a novel line structure applicable to the semiconductor device of the present; invention. As shown in FIG. 18, this line structure includes: a grounded conductor layer 702 made up of plural pairs of titanium and gold layers alternately stacked to be about 0.7 μm thick on the surface of a GaAs substrate 701; and a gold-plated line 705 provided over the grounded conductor layer 702 to be spaced apart therefrom. A multilayer structure including a silicon nitride film 703 (thickness: about 0.1 μm to about 2.0 μm) and a strontium titanate (SrTiO₃) film (thickness: about 0.1 μm to about 2.0 μm) 704, is formed on the grounded conductor layer 702. An RF active component, like a MESFET as described in the background section, is actually formed on the GaAs substrate 701, but is not shown in FIG. 18 for the sake of simplicity.

By controlling the thicknesses of the silicon nitride film 703 and strontium titanate (SrTiO₃) film 704, the capacitance formed between the layer 702 and the line 705 can be reduced and the increase in electrical length can be suppressed.

It should be noted that the member(s) 103 and/or 104 of the first embodiment may have such a multilayer structure including a plurality of layers with mutually different dielectric constants.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:

a conductor layer formed on a semiconductor substrate and applied with a ground potential;

a dielectric film formed on the conductor layer; and a conductor line formed on the dielectric film such that a bottom face of the conductor line is opposite to a top face of the conductor layer with the dielectric film interposed therebetween, wherein the dielectric film comprises a first dielectric portion interposed between the conductor layer and the conductor line and a second dielectric portion which is formed on a side face of the first dielectric portion and has a different dielectric constant from that of the first dielectric portion.

2. The device of claim 1, wherein the first dielectric portion comprises silicon nitride, and the second dielectric portion contains titanium.

3. The device of claim 1, wherein the dielectric constant of the second dielectric portion is larger than 10.

4. The device of claim 1, further comprising a second dielectric film formed so as to cover the conductor line.

5. The device of claim 1, further comprising an active component operable at radio frequencies on the semiconductor substrate, the active component being electrically connected with at least one of the conductor layer and the conductor line.

6. A semiconductor device comprising:

a conductor layer formed on a semiconductor substrate and applied with a ground potential;

a dielectric film formed on the conductor layer; and a conductor line formed on the dielectric film such that a bottom face of the conductor line is opposite to a top face of the conductor layer with the dielectric film interposed therebetween, wherein the dielectric film comprises two or more dielectric layers with mutually different dielectric constants, and wherein at least one of the two or more dielectric layers comprises:

a first dielectric portion interposed between the conductor layer and the conductor line; and a second dielectric portion formed on a side face of the first dielectric portion and has a different dielectric constant from that of the first dielectric portion.

7. A semiconductor device comprising:

a conductor layer formed on a semiconductor substrate and applied with a ground potential;

a dielectric film formed on the conductor layer;

a conductor line formed on the dielectric film such that a bottom face of the conductor line is opposite to a top face of the conductor layer with the dielectric film interposed therebetween; and a second dielectric film having a dielectric constant larger than 10 formed so as to cover the conductor line, wherein the dielectric film comprises two or more dielectric layers with mutually different dielectric constants.

8. A semiconductor device comprising:

a coplanar conductor layer which is formed over a semiconductor substrate and comprises a conductor line and two conductor layers extending along the conductor line on opposite sides of the conductor line, each with a distance from the conductor line, each of the conductor layers being applied with a ground potential; and a dielectric film formed so as to cover the coplanar conductor layer, wherein the dielectric film has a dielectric constant larger than 10.

9. The device of claim 8, further comprising a second dielectric film which is formed between the semiconductor substrate and the coplanar conductor layer and has a dielectric constant larger than 10.

10. device of claim 8, further comprising an active component operable at radio frequencies on the semiconductor substrate, the active component being electrically connected to the coplanar conductor layer.

11. A semiconductor device comprising:

a first dielectric film formed on a semiconductor substrate;

a coplanar conductor layer formed on the first dielectric film, the coplanar conductor layer comprising a conductor line on the first dielectric film, and two conductor layers extending along the conductor line on opposite sides of the conductor line, each with a distance from the line, each of the conductor layers being applied with a ground potential; and a second dielectric film formed so as to cover the coplanar conductor layer, wherein at one of the first and second dielectric films contains titanium.

12. The device of claim 11, wherein the first dielectric film comprises two or more dielectric layers with mutually different dielectric constants.

13. The device of claim 11, further comprising an active component operable at radio frequencies on the semiconductor substrate, the active component being electrically connected to the coplanar conductor layer.

* * * * *

UNITED STATES PATENT AND TRADEMARK OFFICE
CERTIFICATE OF CORRECTION

PATENT NO. : 6,800,929 B1
DATED : October 5, 2004
INVENTOR(S) : Masaaki Nishijima It is certified that error appears in the above-identified patent and that said Letters Patent is hereby corrected as shown below:

Column 14,
Line 51, "the line" should read -- the conductor line --
Line 55, "at one" should read -- at least one --

Signed and Sealed this

Third Day of May, 2005

JON W. DUDAS
*Director of the United States Patent and Trademark Office*